(12) United States Patent
Bobde et al.

(10) Patent No.: US 9,620,630 B2
(45) Date of Patent: *Apr. 11, 2017

(54) INJECTION CONTROL IN SEMICONDUCTOR POWER DEVICES

(71) Applicant: Alpha and Omega Semiconductor Incorporated, Sunnyvale, CA (US)

(72) Inventors: Madhur Bobde, San Jose, CA (US); Jun Hu, San Bruno, CA (US); Lingpeng Guan, Sunnyvale, CA (US); Hamza Yilmaz, Saratoga, CA (US); Lei Zhang, Shanghai (CN); Jongoh Kim, Suwon (KR)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/072,218

(22) Filed: Mar. 16, 2016

(65) Prior Publication Data

US 2016/0197169 A1    Jul. 7, 2016

Related U.S. Application Data

(63) Continuation of application No. 14/292,692, filed on May 30, 2014, now Pat. No. 9,318,587.

(51) Int. Cl.
*H01L 29/739* (2006.01)
*H01L 29/36* (2006.01)
(Continued)

(52) U.S. Cl.
CPC .......... *H01L 29/7395* (2013.01); *H01L 21/20* (2013.01); *H01L 21/266* (2013.01);
(Continued)

(58) Field of Classification Search
CPC ............ H01L 29/7395; H01L 29/0696; H01L 29/66333; H01L 21/20
See application file for complete search history.

(56) References Cited

U.S. PATENT DOCUMENTS 6,885,063 B2    4/2005    Tagami et al.
8,283,213 B2    10/2012    Bobde et al.
(Continued)

OTHER PUBLICATIONS

Non-Final Office Action for U.S. Appl. No. 12/804,838, dated Mar. 2, 2012.

*Primary Examiner* — Joseph C Nicely
(74) *Attorney, Agent, or Firm* — Joshua D. Isenberg; JDI Patent

(57) ABSTRACT

Semiconductor power devices can be formed on substrate structure having a lightly doped semiconductor substrate of a first conductivity type or a second conductivity type opposite to the first conductivity type. A semiconductive first buffer layer of the first conductivity type formed above the substrate. A doping concentration of the first buffer layer is greater than a doping concentration of the substrate. A second buffer layer of the second conductivity type formed above the first buffer layer. An epitaxial layer of the second conductivity type formed above the second buffer layer. One or more heavily doped regions of the second conductivity type are formed through portions of the first buffer layer from the second buffer layer and into corresponding portions of the substrate. This abstract is provided with the understanding that it will not be used to interpret or limit the scope or meaning of the claims.

30 Claims, 8 Drawing Sheets

(51) Int. Cl.
  *H01L 29/10* (2006.01)
  *H01L 29/06* (2006.01)
  *H01L 29/74* (2006.01)
  *H01L 29/66* (2006.01)
  *H01L 21/265* (2006.01)
  *H01L 21/20* (2006.01)
  *H01L 29/08* (2006.01)
  *H01L 21/266* (2006.01)
  *H01L 29/423* (2006.01)

(52) U.S. Cl.
  CPC .... *H01L 21/26513* (2013.01); *H01L 29/0696* (2013.01); *H01L 29/0834* (2013.01); *H01L 29/107* (2013.01); *H01L 29/1079* (2013.01); *H01L 29/1095* (2013.01); *H01L 29/36* (2013.01); *H01L 29/4236* (2013.01); *H01L 29/66333* (2013.01); *H01L 29/66348* (2013.01); *H01L 29/66363* (2013.01); *H01L 29/7397* (2013.01); *H01L 29/74* (2013.01)

(56) References Cited

U.S. PATENT DOCUMENTS

| | | |
|---|---|---|
| 8,441,046 B2 | 5/2013 | Bobde et al. |
| 9,318,587 B2 * | 4/2016 | Bobde ............ H01L 29/7395 |
| 2007/0080379 A1 | 4/2007 | Peake |
| 2007/0138544 A1 | 6/2007 | Hirler et al. |
| 2007/0181927 A1 | 8/2007 | Yedinak et al. |
| 2007/0272978 A1 | 11/2007 | Mauder et al. |
| 2008/0105949 A1 | 5/2008 | Zhang et al. |
| 2008/0135871 A1 * | 6/2008 | Ruething ............ H01L 29/0696 257/139 |
| 2009/0173993 A1 | 7/2009 | Andrews et al. |
| 2011/0180902 A1 * | 7/2011 | Inagawa ............ H01L 29/0696 257/577 |
| 2012/0161286 A1 * | 6/2012 | Bhalla ............ H01L 27/0647 257/577 |
| 2013/0313634 A1 | 11/2013 | Liu |
| 2014/0124851 A1 | 5/2014 | Gamerith et al. |
| 2015/0035005 A1 * | 2/2015 | Bhalla ............ H01L 27/0629 257/140 |
| 2015/0155277 A1 * | 6/2015 | Ogura ............ H01L 27/0761 257/140 |
| 2015/0270378 A1 | 9/2015 | Konishi et al. |
| 2015/0288151 A1 | 10/2015 | Yedinak et al. |
| 2015/0333168 A1 * | 11/2015 | Hirler ............ H01L 29/0615 257/329 |

* cited by examiner

INJECTION CONTROL IN SEMICONDUCTOR POWER DEVICES

CLAIM OF PRIORITY

This application is a continuation of U.S. patent application Ser. No. 14/292,692, filed May 30, 2014, the entire contents of which are incorporated herein by reference in their entirety.

FIELD OF THE INVENTION

This present disclosure relates in general to the semiconductor power devices, and more particularly to configurations and methods for manufacturing semiconductor power devices to improve the collector-emitter saturation voltage and avoid backside implant.

BACKGROUND OF THE INVENTIONS

An insulated gate bipolar transistor (IGBT) is a semiconductor power device with a compositing structure that combines features of a metal-oxide-semiconductor field effect transistor (MOSFET) and a bipolar junction transistor (BJT). With the MOSFET's characteristic of easy control with a gate electrode, the bipolar current flow mechanism, and the advantages of shorter switching time and lower power loss, IGBTs have been widely applied in a high voltage and high power application.

In order to lower the on-resistance of the IGBT, field stop IGBTs have been developed. Field stop IGBTs generally have a (n-type) buffer layer at the bottom of the drift region and a thin implanted (p-type) collector region below the buffer layer. The collector region has a reduced number of charges compared to punch through IGBTs, and so has controlled minority carrier injection. The buffer layer acts as a field stop and terminates the electric field. For field stop IGBTs, it is important to carefully control the charge levels in the buffer layer and the collector layer.

Conventional technologies to configure and manufacture semiconductor power devices, particularly field stop IGBT devices, are still confronted with difficulties and limitations due to various tradeoffs and uncertainties in controlling the thickness and dopant concentration of the backside layers. In IGBT devices, there is a tradeoff between conduction loss and turn-off switching losses, $E_{off}$. Conduction loss depends upon the collector to emitter saturation voltage $V_{ce(SAT)}$ at rated current. Greater carrier injection while the device is on improves the conductivity of the device, thus reducing conduction loss. Increased carrier injection would, however, cause higher turn-off switching losses because of energy dissipated in clearing out injected carriers during turn-off. However, for applications where switching losses do not dominate, greater carrier injection from the backside can reduce conduction loss and improve the collector to emitter saturation voltage $V_{ce(SAT)}$ at rated current. Examples of applications where switching losses do not dominate include, e.g., induction heating, and low frequency motor drives.

There are several conventional methods of manufacturing IGBTs with backside processing steps. In one implementation, the starting material is a single semiconductor substrate layer (such as N type) without an additional epitaxial layer atop. The top side processing steps are performed to form the IGBT structures on the top side of the substrate. After backside grinding, a backside N-type implant is performed to form an N-type buffer layer followed by a P-type implant to form the bottom P collector layer. A backside metal layer is formed to function as the drain/collector electrode. This process requires two backside implant operations and backside activation/anneal operation. In addition, the anneal processes on the backside layer can only be performed at a low temperature due to the limitations imposed by the already existing topside IGBT structures and metal layer. The laser anneal mitigates this by using short pulses of localized high temperatures on the wafer backside, which do not increase the wafer topside temperature substantially. However, laser anneal are typically shallow (typically on the order of 1 μm), and cannot anneal out the damages cause by the deeper N implant that is used to create the N buffer region.

An alternative implementation includes a starting material of an N-type substrate supporting an N-type epitaxial layer over it. The substrate is doped with volumetric doping concentration of the N-type buffer layer. After the topside processing steps to form IGBT structures on the top side of the substrate, the backside grinding is performed to reduce the lower N-type substrate layer to a predefined thickness. Ideally, the pre-defined thickness together with the volumetric doping concentration of the lower N-substrate layer result in the desired per area charge level of the buffer region. A bottom P-type layer is then formed from a backside P-type implant. A backside metal layer is in turn formed to function as the drain electrode. This implementation does not require a high temperature anneal after backside grinding for the N-type buffer layer because it is already doped as the starting lower substrate layer. However, these manufacturing processes encounter difficulties being unable to accurately control the backside grinding thickness with a tightly controlled tolerance. Variations in the thicknesses of N-type buffer layer vary charge levels in the N-type buffer layer and thus adversely affecting performance of the IGBT devices.

Another class of IGBT called the Reverse Conducting IGBT (RC-IGBT) are popular in the industry. These IGBTs combine the free-wheeling diode in the device structure, thereby eliminating the need for co-packaging a separate Diode chip with the IGBT. However, the conventional method for making RC-IGBT relies on a masking step on the wafer backside of a very thin wafer, after it has completed the topside process and has been background to 2 to 4 mil thickness. At such thicknesses, the silicon wafers are warped & difficult to handle which makes the process of masking extremely difficult.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Figure 1:
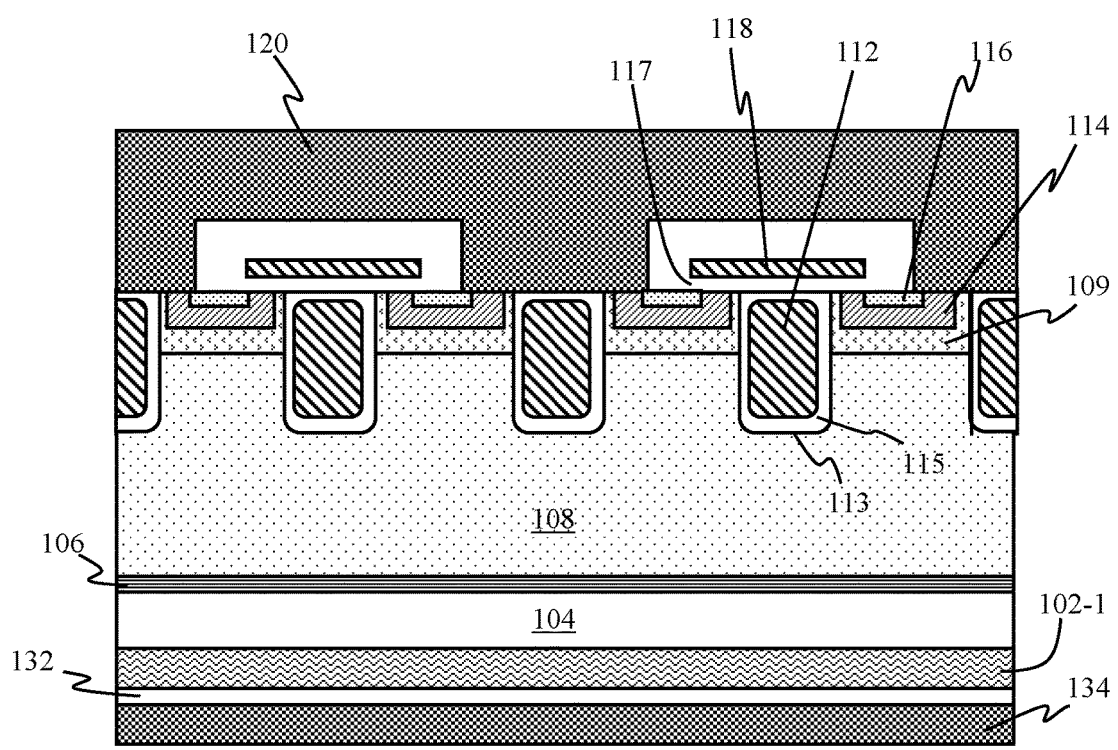
FIG. 1 is a cross-sectional schematic diagram of a semiconductor power device according to an embodiment of the present disclosure.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," "above", "below", "on top of", "underneath", etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Commonly owned U.S. Pat. No. 8,283,213 proposes a configuration and method for manufacturing a semiconductor power device with a buffer region formed as part of the starting wafer with its thickness and charge level already set before topside processing, entire contents of which are herein incorporated by reference. Specifically, the processes start with forming a light doped layer of either P-type or N-type semiconductor materials. An epitaxial growth process is performed to form at least a buffer layer and a drift layer over the substrate. After the topside processing steps to form IGBT structures on the top side of the substrate, the backside grinding is performed to reduce the substrate to a thickness about 100 to 120 microns. A backside implant is performed to form the bottom collector layer. The backside implant is followed by low temperature or rapid thermal anneal. Thereafter, a backside metal layer is formed to function as the drain/collector electrode. Such configuration and manufacturing processes limit the amount of activation by rapid thermal anneal at about 450° C. for about 60 seconds or anneal process at 350° C. for about 6 hours. The anneal process has to be handled carefully because the top metal layer may melt at 400° C. Nevertheless, amount of activation is less than 0.1%. While this amount of activation may be sufficient for applications where switching losses dominate, it is not enough for applications where conduction losses dominate.

Some other proposed methods involve using laser annealing from the backside to get local melting and re-crystallization of silicon. While these methods may improve the amount of activation up to 100%, it cannot be applied for annealing the damages that are deeper in silicon, in the range of 2.5 μm and above, since laser penetration in silicon is in the order of 1 μm.

The present disclosure describes an improved configuration and method for manufacturing a semiconductor power device that has high level activation with deep implant and improved $V_{cesat}$ for application where conduction loss tends to dominate. Specifically, for an N-type device as an example, an additional P-type layer is formed on either a lightly doped P-type or N-type substrate. With the P-type layer, the amount of injection, the doping and thickness of the P layer can be controlled. Activation of 100% can be achieved during high temperature topside processing. The annealing process is required only for making the ohmic contact to the backside metal.

Aspects of the present disclosure describe a substrate structure for a semiconductor device. The substrate structure includes a lightly doped semiconductor substrate of a first conductivity type or a second conductivity type opposite to the first conductivity type. A semiconductive first buffer layer of the first conductivity type is formed above the lightly doped semiconductor substrate. A doping concentration of the first buffer layer is greater than a doping concentration of the lightly doped semiconductor substrate. A semiconductive second buffer layer of the second conductivity type is formed above the first buffer layer. A semiconductive epitaxial layer of the second conductivity type formed above the second buffer layer, wherein a doping concentration of the epitaxial layer is greater than a doping concentration of the second buffer layer.

In some aspects one or more semiconductor power device structures formed at a top side of the substrate structure.

In some implementations, the one or more power device structures may include one or more trenches formed in the epitaxial layer, wherein a conductive material is disposed in the trenches with a dielectric material lining the trenches between the conductive material and sidewalls of the trenches; one or more planar gates each formed over a corresponding trench with an insulation layer provided between the planar gate and the corresponding trench; and one or more heavily doped contact regions of the second conductivity each surrounded by a corresponding body region of the first conductivity type, wherein the body region of the first conductivity type is formed in the substrate structure and between two neighboring trenches.

Other aspects of the present disclosure describe a method for fabricating a substrate and epitaxial structure. The method comprises forming a substrate structure comprising a lightly doped semiconductor substrate of a first conductivity type or a second conductivity type opposite to the first conductivity type; forming a semiconductive first buffer layer of the first conductivity type above the lightly doped semiconductor substrate, wherein a doping concentration of the first buffer layer is greater than a doping concentration of the lightly doped semiconductor substrate; forming a semiconductive second buffer layer of the second conductivity type above the first buffer layer; and forming a semiconductive epitaxial layer of the second conductivity type above the second buffer layer, wherein a doping concentration of the epitaxial layer is greater than a doping concentration of the second buffer layer.

Aspects of the present disclosure will be described below in terms of examples and it is to be understood that such disclosure is not to be interpreted as limiting. Various alterations and modifications will no doubt become apparent to those skilled in the art after reading the disclosure.

FIG. 1 illustrates a semiconductor power device according to an aspect of the present disclosure. In the following description, N-type devices are described for purposes of illustration. It should be noted that the present disclosure may be applied to P-type devices by reversing the polarities of the conductivity types of the various regions and layers. In the example shown in FIG. 1, the device is an insulated gate bipolar transistor (IGBT) device. However, the configurations and methods described in the present disclosure are not limited to IGBT devices but also other semiconductor power devices, such as thyristors, MOS-controlled thyristors or reverse conducting IGBT devices.

As shown in FIG. 1, a plurality of N-type IGBT devices 100 include the IGBT structures formed on top of a starting material that may include a substrate 102-1 supporting a P-type layer 104, an N-type buffer layer 106, an N-type drift layer 108 and an N-type injection enhancement layer 109. Each of the IGBT structures may include a conductive material 112 filled in a trench 113 formed from a top surface of the N-type injection enhancement layer 109 into a top portion of the N-type epitaxial layer 108. The trench 113 is lined with a dielectric material 115 between the conductive material 112 and sidewalls of the trench 113. The IGBT structure also has a planar gate 118 supported on top of a gate insulation layer 117 (e.g., gate oxide). The planar gate can be drawn parallel or orthogonal to the direction of the trenches. In addition, an N-type source region 116 is encompassed by a P-type body region 114 formed in a top portion of the N-type injection enhancement layer 109 between adjacent trenches 113. The P-type body region 114 is extended below and from the sides of the N-type source region 116 to a region underneath the gate insulation layer 117 and is spaced away from sidewalls of the trenches 113 as shown in FIG. 1. A top metal layer 120 is disposed on a top surface of the IGBT structures. Furthermore, a second P-type layer 132 and a backside metal layer 134 are attached to the backside of the substrate 102-1.

Figure 2A:
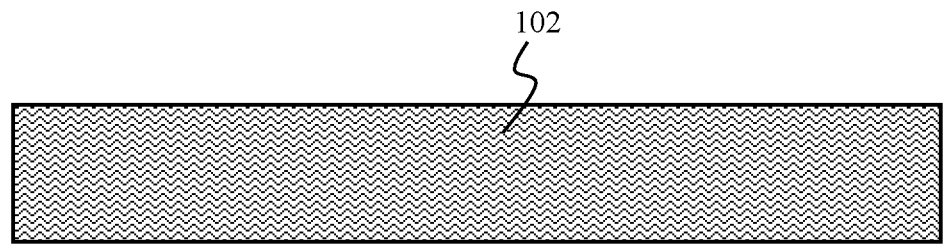
FIGS. 2A-2D are a sequence of cross-sectional schematic diagrams illustrating a method of fabrication of the device of FIG. 1.

FIGS. 2A-2D are a sequence of cross-sectional views for illustrating the processes for manufacturing a semiconductor device of FIG. 1. FIG. 2A shows a lightly doped substrate 102 of an N-type, P-type or intrinsic semiconductor material. By way of example and not by way of limitation, the doping concentration of an N-type/P-type substrate 102 may be in a range between 1e13 to 1e15 $cm^{-3}$ (or less than $1e^{15}$ $cm^{-3}$).

Figure 2B:
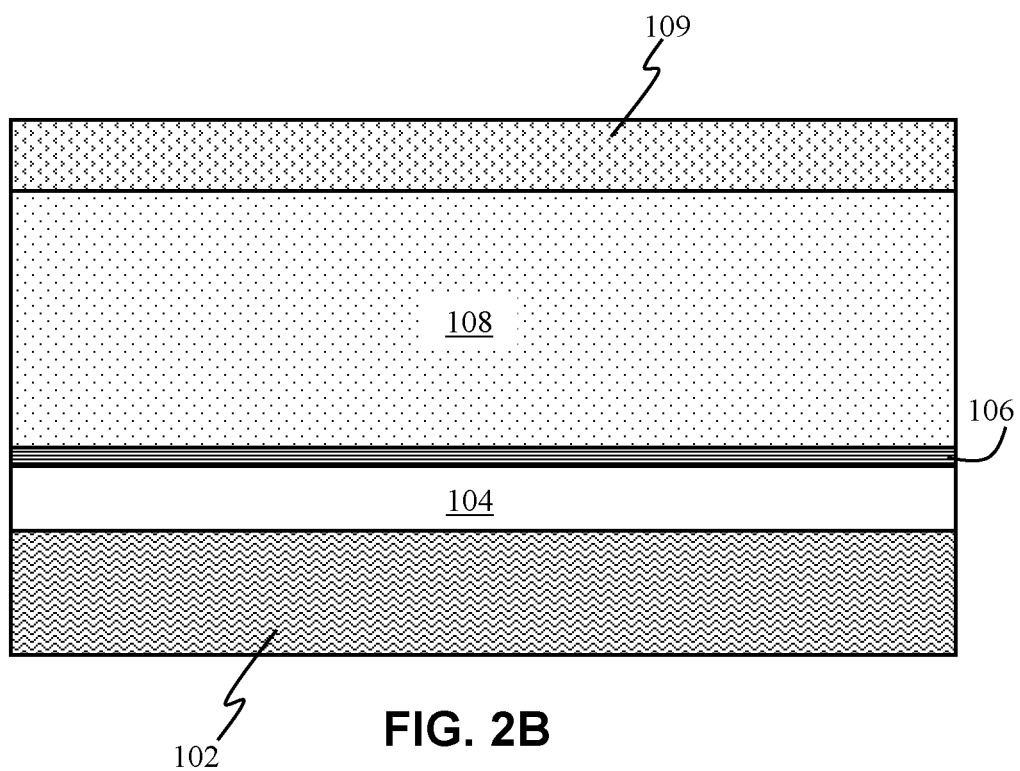

FIG. 2B shows that a P-type layer 104, an N-type layer 106, an N-type epitaxial layer 108 and an N-type injection enhancement layer 109 are formed above the substrate 102. In one implementation, the process may include a 4-step epitaxial growth process to form these layers on top of each other as shown in FIG. 2B. Specifically, a first layer of the epitaxially grown layer is the P-type layer 104. By way of example, and not by way of limitation, the P-type layer 104 may have a doping concentration between approximately 1e15 $cm^{-3}$ and 1e18 $cm^{-3}$, higher than that of the substrate 102. The P-type layer 104 may be in a thickness about 2-5 μm. Next, an N-type layer 106 may be epitaxially grown above the P-type layer 104. By way of example and not by way of limitation, the N-type layer 106 may have a doping concentration between approximately 1e15 $cm^{-3}$ and 1e17 $cm^{-3}$, also higher than the substrate 102. The N-type layer 106 may be in a thickness range of about of about 3 μm to about 15 μm thick. In addition, an N-type epitaxial layer 108 may be grown above the N-type layer 106. By way of example and not by way of limitation, the N-type epitaxial layer 108 may be lightly doped with a concentration between approximately 1e12 $cm^{-3}$ and 1e15 $cm^{-3}$. The N epitaxial layer 108 may be in a thickness range of about 30 μm to about 150 μm thick. Finally, the N injection enhancement layer 109 may be epitaxially grown on top of the N epitaxial layer 108. By way of example and not by way of limitation, the N injection enhancement layer 109 may have a doping concentration between approximately 1e15 $cm^{-3}$ and 5e17 $cm^{-3}$, higher than that of the substrate 102. The N injection enhancement layer 109 may be in a thickness range of about 2 μm to about 5 μm thick. By way of example, and not by way of limitation, the N-type dopants may be phosphorus, arsenic, or antimony, and the P-type dopants may be boron or $BF_2$.

In another implementation, the process may include a blanket implant of P-type dopants to form the P-type layer 104, followed by a 3-step epitaxial growth to form the N-type layer 106, the N-type epitaxial layer 108 and an N-type injection enhancement layer 109. In this implementation, the depth and doping concentration of the P-type layer 104 can be controlled by the implant energy and the implant dose. By way of example and not by way of limitation, the P-type layer 104 may be formed by ion implantation at an energy of about 200K eV to about 1000 KeV with a dose of about 1e12 to about 1e14 $cm^{-2}$. The dopants used to form the P-type layer 104 may be boron or $BF_2$. Dopants of the P-type layer 104 would be fully activated by the thermal cycles from the topside processing as discussed below.

Figure 2C:
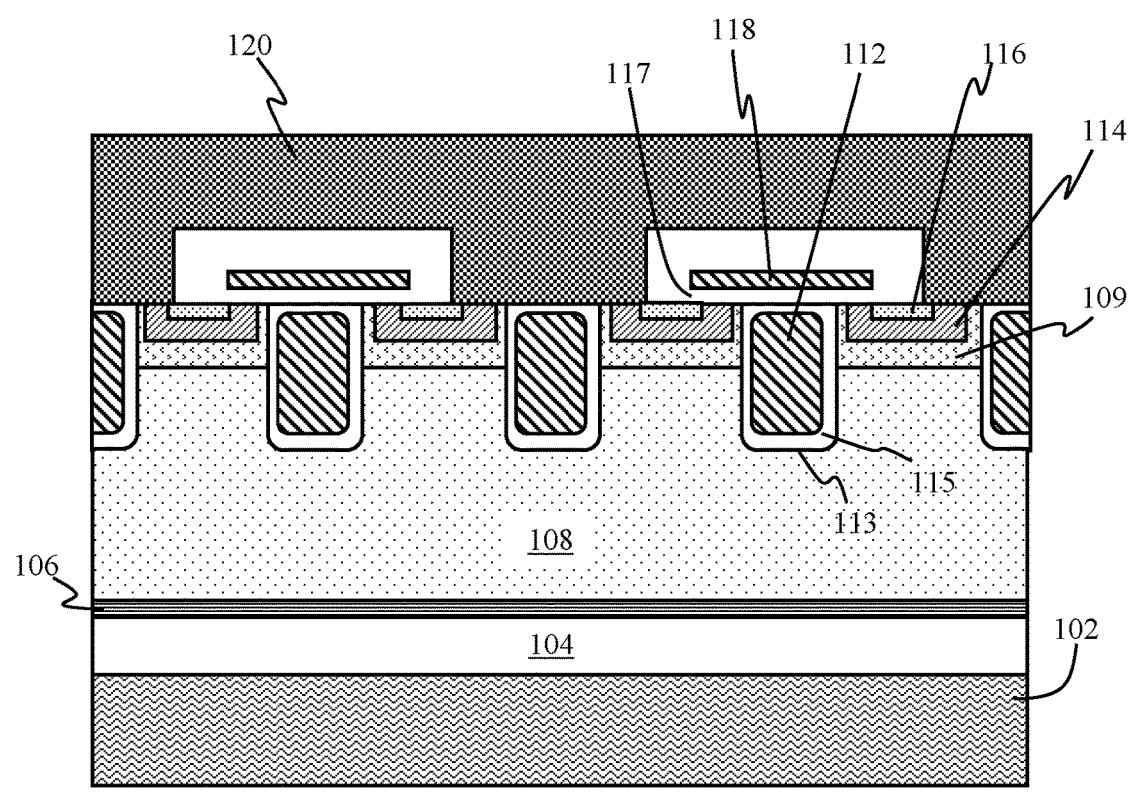

After the starting material has been formed, a conventional topside processing can be performed to form the topside IGBT structures as shown in FIG. 2C. Specifically, trenches 113 are formed by etching through the N-type injection enhancement layer 109 and into the N-type epitaxial layer 108. The trenches 113 may be lined with a dielectric material 115 (e.g., oxide). In one implementation, the dielectric material 115 may be formed on the sidewalls of the trenches through an oxide deposition process. Thereafter, a conductive material (e.g., polysilicon) is then filled into the trenches 113 to form trench gate 112. A planar gate 118 is formed over the trenches 113 with an insulation layer 117 therebetween. A P-type body region 114 and the N-type source region 116 are formed (e.g., by implantation) in the N-type injection enhancement layer 109. By way of example and not by way of limitation, the P-type body region 114 may have a doping concentration between approximately 5e16 $cm^{-3}$ and 5e17 $cm^{-3}$. Also the N-type source region 116 may be heavily doped with a doping concentration between 1e18 $cm^{-3}$ and 1e20 $cm^{-3}$. A top metal layer 120 is formed on the top surface contacting the N-type source region 116 and P-type body region 114.

Figure 2D:
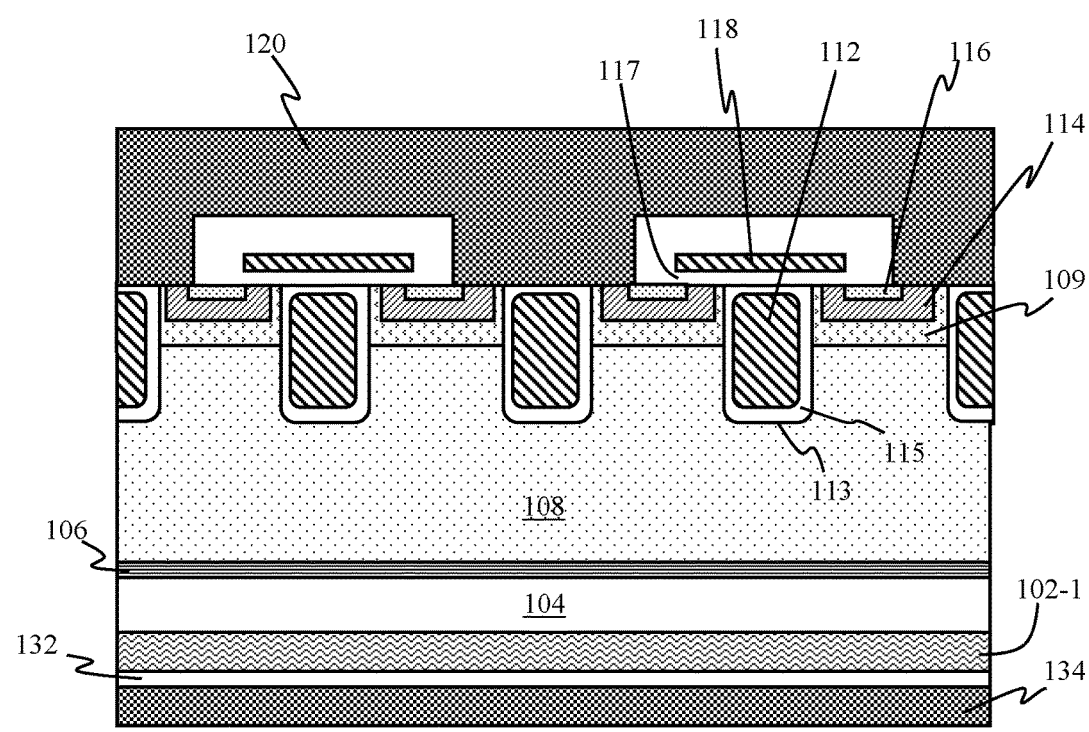

Additional processing may be performed to produce the finished devices 100, as shown in FIG. 2D. For example, after the topside processing is completed, a backside grinding can be carried out to grind the back of the substrate 102 down to a remaining substrate 102-1 with a pre-defined thickness. By way of example, the thickness of the substrate 102-1 may be between about 1 μm and about 10 μm. It should be noted that the thickness of the remaining substrate 102-1 is not critical so long as the back grinding process does not reach all the way to the P-type layer 104. A second P-type layer 132 may then be formed at the bottom surface of the substrate 102-1 by backside implant and a low temperature anneal to partially activate the dopant Thereafter, a backside metal layer 134 can be formed on the bottom surface as the drain electrode followed by a post metal anneal for alloying & forming an ohmic contact.

According to the embodiment above, the N-type layer 106 is already formed together with its dopants in crystalline form through epitaxial growth before the topside processing is carried out to form the top metal layers of the IGBT device. Depending on the implementation method, the P-type layer 104 may be either activated when it is epitaxially grown, or by the thermal cycles from the topside processing. Thus, a later annealing process is not necessary to activate the P-type or N-type layer dopants because the dopants are already activated.

Figure 3:
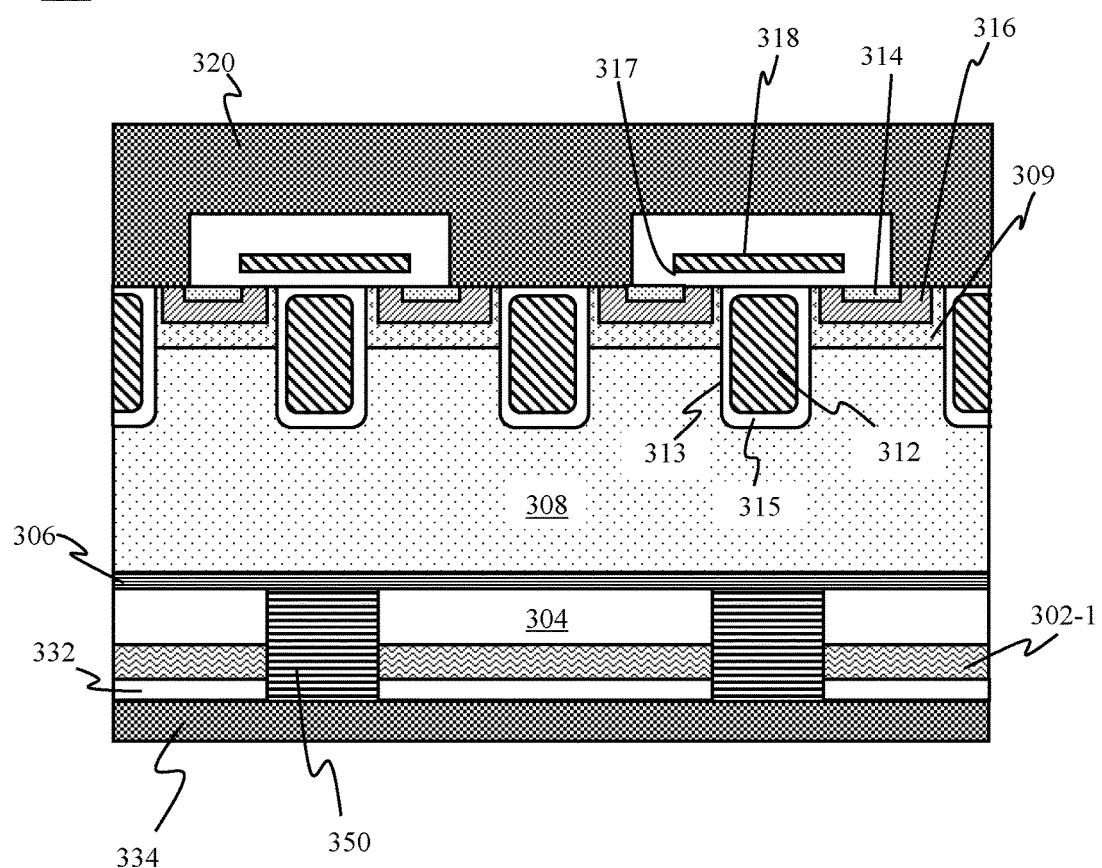
FIG. 3 is a cross-sectional schematic diagram of a semiconductor power device according to an embodiment of the present disclosure.

FIG. 3 illustrates an implementation of a reverse conducting IGBT device according to an aspect of the present disclosure. Generally, a reverse conducting IGBT device requires an N-type buffer region or an N-type drift region to be selectively shorted to the collector electrode. This short allows the formation of an anti-parallel diode, which enables current conduction in the IGBT in a reverse mode (i.e., current flows from a cathode/emitter terminal to the anode/collector terminal). Thus, a heavily doped N-type region is usually embedded in an anode/collector region of the IGBT.

It should be noted that N-type devices are described for purposes of illustration. The present disclosure may be applied to P-type IGBT devices by reversing the polarities of the regions and layers. In addition, in the following description, elements in FIGS. 3 and 4A-4F identical to the elements discussed in connection with FIGS. 1 and 2A-2D will be identified using the same last two digital reference numeral. For simplicity, the description of these identical elements will not be repeated below and reference will be made to the above description in connection with FIGS. 1 and 2A-2D.

FIG. 3 depicts a plurality of N-type reverse conducting IGBT devices 300 that is substantially similar to IGBT devices 100 of FIG. 1 with the exception that the starting material of the reverse conducting IGBT devices 300 includes a heavily doped N-type region 350 for each reverse conducting IGBT device. The N-type region 350 extends through the P-type layer 304 and the substrate 302-1 and a second P layer 332. The N-type region 350 is in contact with the N-type layer 306 at one end and the backside metal layer 334 at the other end.

The IGBT structures including a trench gate 312, a planar gate 318, an N-type source region 314, a P-type body region 316 are formed in the starting material, and a top metal layer 320 is disposed on a top surface of the IGBT structures as shown in FIG. 3. Furthermore, a second P-type layer 332 and a backside metal layer 334 are formed at the backside of the substrate 302-1. The second P-type layer 332 provides an ohmic contact between the substrate 302-1 and the metal layer 334.

Figure 4A:
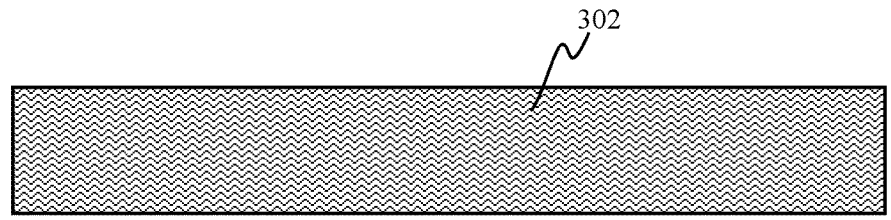
FIGS. 4A-4F are a sequence of cross-sectional schematic diagrams illustrating a method of fabrication of the device of FIG. 3.
Figure 4B:
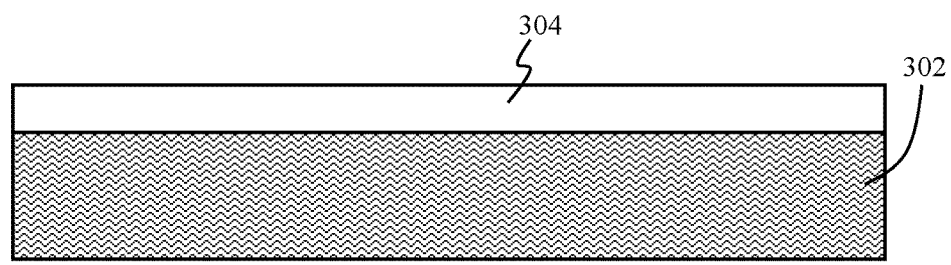
Figure 4C:
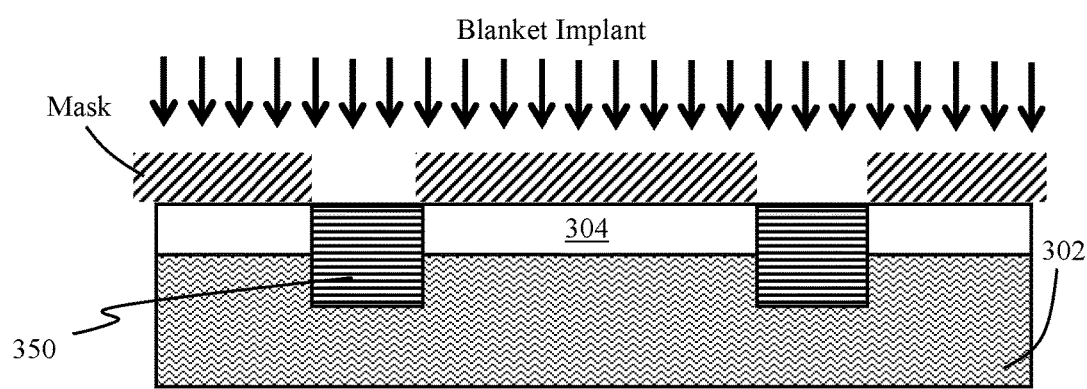

FIGS. 4A-4F are a sequence of cross-sectional views for illustrating the processes for manufacturing a semiconductor device of FIG. 3. FIG. 4A shows a lightly doped substrate 302 of an N-type, P-type or intrinsic semiconductor material. In one example, the doping concentration of an N-type/P-type substrate 302 may be in a range between 1e12 to 1e15 cm$^{-3}$ (or less than 1e$^{15}$ cm$^{-3}$). In one implementation, the process starts with forming a P-type layer 304 in the substrate 302 by epitaxial growth process. By way of example, and not by way of limitation, the P-type layer 304 may have a doping concentration between approximately 1e15 cm$^{-3}$ and 1e18 cm$^{-3}$, higher than that of the substrate 302. The P buffer layer 304 may be in a thickness about 2 to 5 μm. Next, a masked implant may be performed to form a heavily doped N-type region 350 in the substrate 302 as shown in FIG. 4C. By way of example and not by way of limitation, the N-type region 350 may be formed by ion implantation at about 100k eV to about 1000K eV with a dose of about 5e14 to about 1e16 cm$^{-2}$. In another implementation, the process starts with forming a P-type layer 304 in the substrate 302 by a blanket implant of P-type dopants. In this implementation, the depth and doping concentration of the P-type layer 304 can be controlled by the implant energy and the implant dose. By way of example and not by way of limitation, the P-type layer 304 may be formed by ion implantation at about 200K eV to about 1000K eV with a dose of about 1e12 to about 1e14 cm$^{-2}$. Next, a masked implant may be performed to form an N-type region 350 in the substrate 302 as shown in FIG. 4C. In this implementation, the N-type region 350 may be formed prior to forming the implanted P-type layer 304.

Figure 4D:
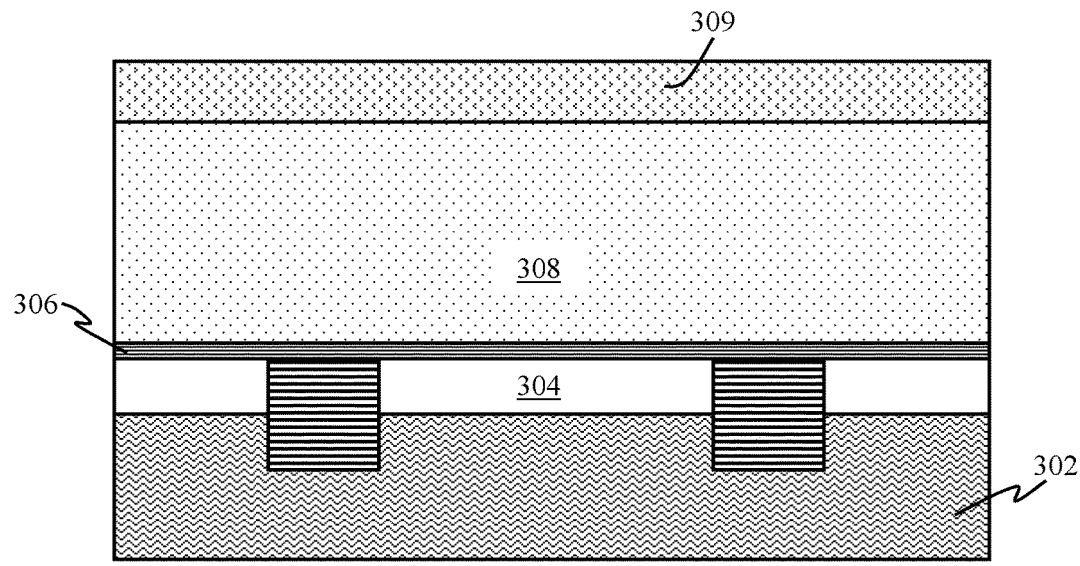
Figure 4E:
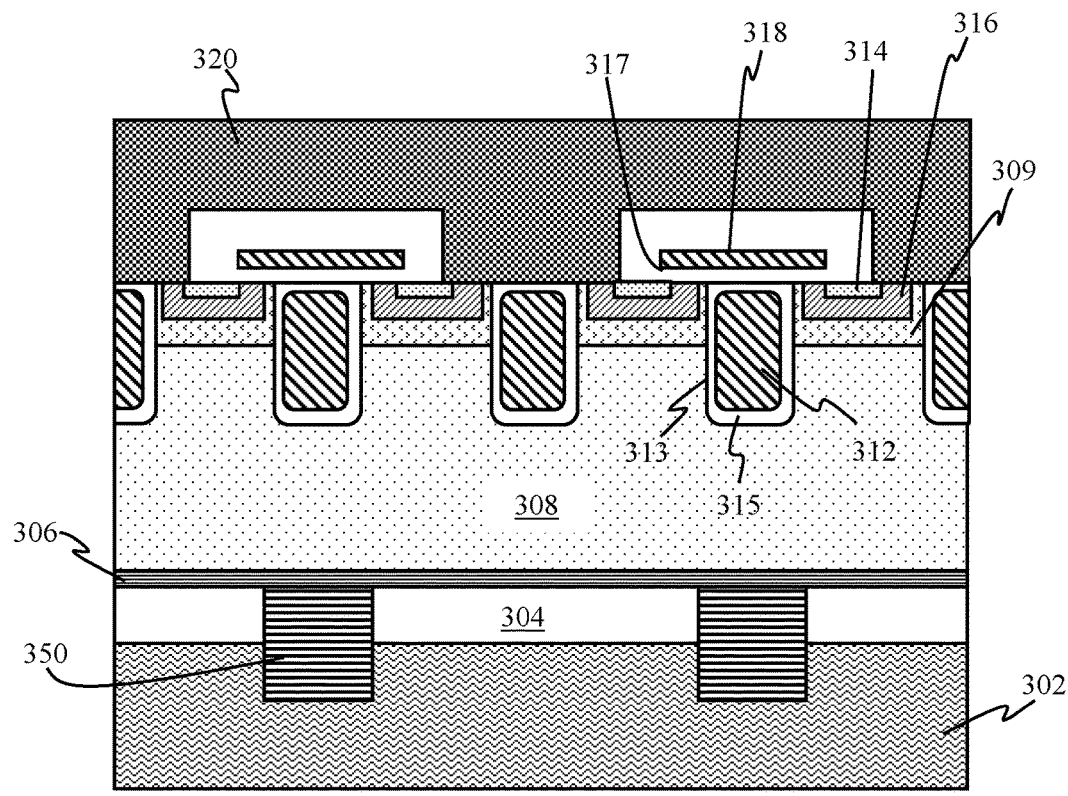
Figure 4F:
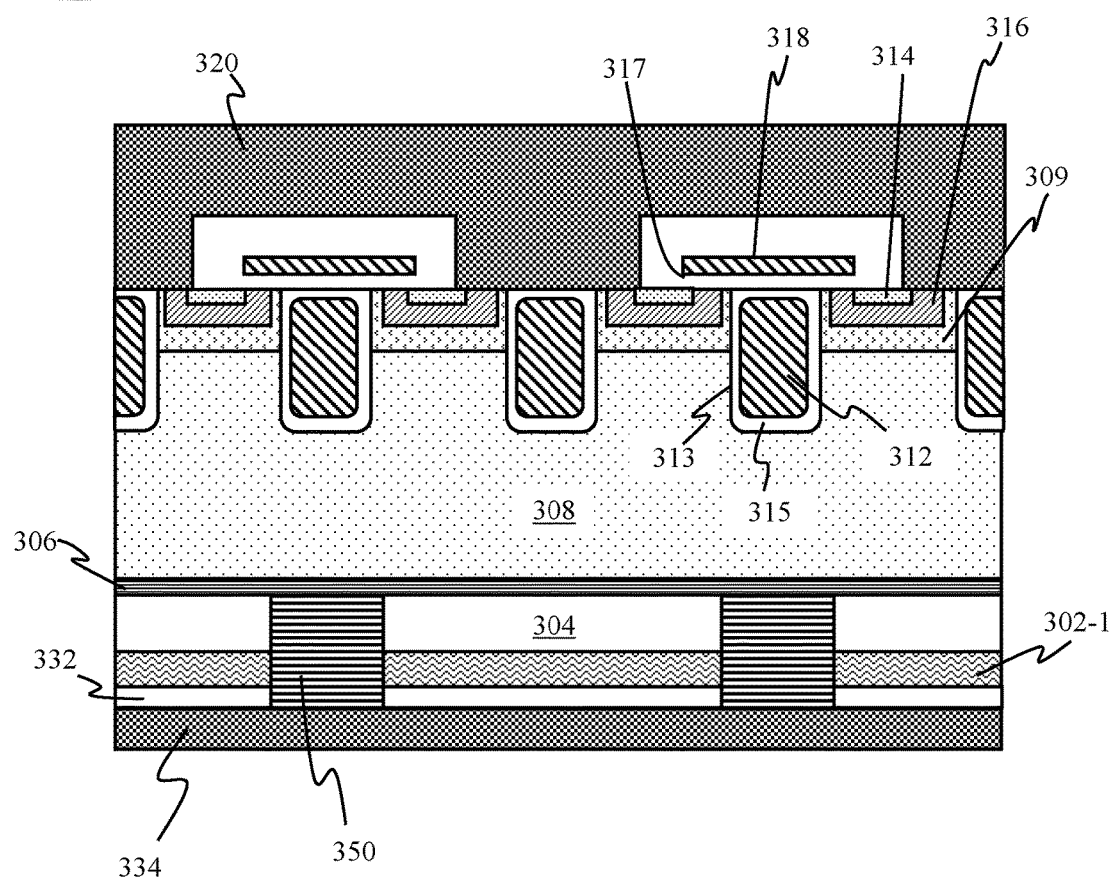

After forming the P-type layer 304 and the N-type region 350, a 3-step epitaxial growth is performed to form an N-type layer 306, the N-type epitaxial layer 308, and the N-type injection enhancement layer 309, as shown in FIG. 4D. Subsequent processing forms the topside IGBT structures, as shown in FIG. 4E. Additional processing may be performed to produce the finished devices 300, as shown in FIG. 4F. For example, after the topside processing, a back grinding is carried out to grind the back of the substrate 302 down to a remaining substrate 302-1. A second P-type layer 332 is formed at the bottom surface of the substrate 102-1 by backside implant and a low temperature anneal to partially activate the dopant Then a backside metal layer 334 is formed on the bottom surface as the drain electrode. The backside grinding is performed such that the N-type layer 306 is electrically connected to create RC effect.

Table I below shows performance comparison of various semiconductor power devices. Device 1 is a conventional device without a P-type layer formed on the top side of the substrate. Device 2 has an epitaxially grown P-type layer having a resistivity of 0.9 ohm-cm and a thickness of 5 μm. For Device 3, 500 keV Boron with a dose of 5e$^{12}$ cm$^{-2}$ is implanted into the substrate to form a P-type layer. For Device 4, its P-type layer is implanted at 500 keV with a dose of 7.5e$^{12}$ cm$^{-2}$. From the table, devices according to the present disclosure (e.g., Devices 2-4) have lower $V_{ce(SAT)}$ and thus improved performance for applications where induction heating switching losses do not dominate.

TABLE I

| | P layer | Thickness of the N buffer | $V_{ce(SAT)}$ | BV_turn |
|---|---|---|---|---|
| Device 1 | N/A | 5 | 1.51 | 1650 |
| Device 2 | Epitaxial grown, 0.9 ohm · cm, 5 μm | 11 | 1.39 | 1639 |
| Device 3 | Implant with 500 Kev and 5.00E+12 | 11 | 1.421 | 1673 |
| Device 4 | Implant with 500 Kev and 7.50E+12 | 11 | 1.37 | 1652 |

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" or "step for" performing a specified function, is not to be interpreted as a "means" or "step" clause as specified in 35 USC §112(f).

What is claimed is:

1. A substrate structure, comprising:
a lightly doped semiconductor substrate of a first conductivity type or a second conductivity type opposite to the first conductivity type;
a semiconductive first buffer layer of the first conductivity type formed above the lightly doped semiconductor substrate, wherein a doping concentration of the first buffer layer is greater than a doping concentration of the lightly doped semiconductor substrate;
a semiconductive second buffer layer of the second conductivity type formed above the first buffer layer;
a semiconductive epitaxial layer of the second conductivity type formed above the second buffer layer; and one or more heavily doped regions of the second conductivity type formed through portions of the first buffer layer from the second buffer layer and into corresponding portions of the lightly doped semiconductor substrate.

2. The substrate structure of claim 1, wherein the first conductivity type is P-type and the second conductivity type is N-type.

3. The substrate structure of claim 1, further comprising an injection enhancement layer of the second conductivity type formed above the epitaxial layer, wherein a doping concentration of the injection enhancement layer is greater than the doping concentration of the epitaxial layer of the second conductivity type.

4. The substrate structure of claim 1, further comprising a semiconductor layer of the first conductivity type formed on a backside of the lightly doped semiconductor substrate.

5. The substrate structure of claim 4, wherein the one or more heavily doped regions of the second conductivity type are formed through the lightly doped semiconductor substrate and through the semiconductor layer of the first conductivity type formed on the backside of the lightly doped semiconductor substrate.

6. The substrate structure of claim 5, further comprising a metal layer formed on a surface of the semiconductor layer of the first conductivity type formed on the backside of the lightly doped semiconductor substrate, wherein the one or more heavily doped regions of the second conductivity type make electrical contact with the metal layer.

7. A semiconductor power device, comprising:
a substrate structure comprising a lightly doped semiconductor substrate of a first conductivity type or a second conductivity type opposite to the first conductivity type;
a semiconductive first buffer layer of the first conductivity type formed above the lightly doped semiconductor substrate, wherein a doping concentration of the first buffer layer is greater than a doping concentration of the lightly doped semiconductor substrate;
a semiconductive second buffer layer of the second conductivity type formed above the first buffer layer; and
a semiconductive epitaxial layer of the second conductivity type formed above the second buffer layer;
one or more heavily doped regions of the second conductivity type formed through portions of the first buffer layer from the second buffer layer and into corresponding portions of the lightly doped semiconductor substrate; and
one or more semiconductor power device structures formed at a top side of the substrate structure.

8. The device of claim 7, wherein the one or more semiconductor power device structures include one or more trenches formed in the substrate structure, wherein a conductive material is disposed in the trenches with a dielectric material lining the trenches between the conductive material and sidewalls of the trenches.

9. The device of claim 8, wherein the one or more semiconductor power device structures further include one or more planar gates each formed over a corresponding trench with an insulation layer provided between each planar gate and corresponding trench.

10. The device of claim 9, wherein the one or more semiconductor power device structures further include one or more heavily doped contact regions of the second conductivity type, each contact region being surrounded by a corresponding body region of the first conductivity type, wherein the body region is formed in the substrate structure between two neighboring trenches.

11. The device of claim 7, wherein the one or more semiconductor power device structures includes one or more insulated gate bipolar transistor (IGBT) devices thyristors, MOS-controlled thyristors, or reverse conducting IGBT devices.

12. The device of claim 7, wherein the first conductivity type is P-type and the second conductivity type is N-type.

13. The device of claim 7, further comprising an injection enhancement layer of the second conductivity type formed above the epitaxial layer, wherein a doping concentration of the injection enhancement layer is greater than the doping concentration of the epitaxial layer of the second conductivity type.

14. The device of claim 7, further comprising a semiconductor layer of the first conductivity type formed on a backside of the lightly doped semiconductor substrate.

15. The device of claim 14, wherein the one or more heavily doped regions of the second conductivity type are formed through the lightly doped semiconductor substrate and through the semiconductor layer of the first conductivity type formed on the backside of the lightly doped semiconductor substrate.

16. The device of claim 15, further comprising a metal layer formed on a surface of the semiconductor layer of the first conductivity type formed on the backside of the lightly doped semiconductor substrate, wherein the one or more heavily doped regions of the second conductivity type make electrical contact with the metal layer.

17. A method, comprising:
forming a substrate structure comprising a lightly doped semiconductor substrate of a first conductivity type or a second conductivity type opposite to the first conductivity type;
forming a semiconductive first buffer layer of the first conductivity type above the lightly doped semiconductor substrate, wherein a doping concentration of the first buffer layer is greater than a doping concentration of the lightly doped semiconductor substrate;
forming a semiconductive second buffer layer of the second conductivity type above the first buffer layer;
forming a semiconductive epitaxial layer of the second conductivity type above the second buffer layer; and
forming one or more heavily doped regions of the second conductivity type through portions of the first buffer layer from the second buffer layer and into corresponding portions of the lightly doped semiconductor substrate.

18. The method of claim 17, wherein the first conductivity type is P-type and the second conductivity type is N-type.

19. The method of claim 17, further comprising forming an injection enhancement layer of the second conductivity type above the epitaxial layer, wherein a doping concentration of the injection enhancement layer is greater than the doping concentration of the epitaxial layer.

20. The method of claim 17, wherein forming a layer of a first conductivity type comprises epitaxially growing the layer of the first conductivity type.

21. The method of claim 17, wherein forming the first buffer layer comprises blanket implant of first conductivity type dopants in the lightly doped semiconductor substrate.

22. The method of claim 17, wherein forming the one or more heavily doped substrate regions of the second conductivity type comprises masked implant of second conductivity dopants into portions of the layer of the first conductivity and lightly doped semiconductor substrate.

23. The method of claim 17, further comprising forming one or more semiconductor power device structures at a top side of the substrate structure.

24. The method of claim 23, wherein forming the one or more semiconductor power device structures includes forming one or more trenches in the substrate structure, disposing a conductive material in the trenches with a dielectric material lining the trenches between the conductive material and sidewalls of the trenches.

25. The method of claim 24, wherein forming the one or more semiconductor power device structures further includes forming one or more planar gates each over a corresponding trench and providing an insulation layer between each planar gate and corresponding trench.

26. The method of claim 25, wherein forming the one or more semiconductor power device structures further includes forming one or more heavily doped contact regions of the second conductivity type, wherein each contact region is surrounded by a corresponding body region of the first conductivity type, wherein the body region is formed in the substrate structure between two neighboring trenches.

27. The method of claim 20, wherein the one or more semiconductor power device structures includes one or more insulated gate bipolar transistor (IGBT) devices thyristors, MOS-controlled thyristors, or reverse conducting IGBT devices.

28. The method of claim 17, further comprising forming a semiconductor layer of the first conductivity type on a backside of the lightly doped semiconductor substrate.

29. The method of claim 28, wherein the one or more heavily doped regions of the second conductivity type are formed through the lightly doped semiconductor substrate and through the semiconductor layer of the first conductivity type formed on the backside of the lightly doped semiconductor substrate.

30. The method of claim 29, further comprising forming a metal layer on a surface of the semiconductor layer of the first conductivity type formed on the backside of the lightly doped semiconductor substrate, wherein the one or more heavily doped regions of the second conductivity type make electrical contact with the metal layer.

* * * * *